(12) United States Patent
Chen

(10) Patent No.: US 8,318,516 B2
(45) Date of Patent: Nov. 27, 2012

(54) METHOD OF WAFER LEVEL PURIFYING LIGHT COLOR EMITTING FROM A LIGHT EMITTING SEMICONDUCTOR WAFER

(76) Inventor: Wen-Pin Chen, Taipei County (TW)

( * ) Notice: Subject to any disclaimer, the term of this patent is extended or adjusted under 35 U.S.C. 154(b) by 0 days.

(21) Appl. No.: 13/102,356

(22) Filed: May 6, 2011

(65) Prior Publication Data
US 2011/0275171 A1 Nov. 10, 2011

(30) Foreign Application Priority Data
May 6, 2010 (TW) .............................. 99114564 A

(51) Int. Cl.
*H01L 21/00* (2006.01)
(52) U.S. Cl. .................................. 438/29; 257/E33.06
(58) Field of Classification Search ............ 438/29; 257/E33.06
See application file for complete search history.

(56) References Cited

U.S. PATENT DOCUMENTS

| | | | | |
|---|---|---|---|---|
| 4,442,310 A | * | 4/1984 | Carlson et al. | 136/256 |
| 5,753,319 A | * | 5/1998 | Knapp et al. | 427/529 |
| 6,139,968 A | * | 10/2000 | Knapp et al. | 428/428 |
| 2008/0024854 A1 | | 1/2008 | Izumi et al. | |

FOREIGN PATENT DOCUMENTS

| | | |
|---|---|---|
| CN | 1354371 A | 6/2002 |
| CN | 101383341 A | 3/2009 |
| CN | 201466055 U | 5/2012 |
| TW | 2006015858 A | 1/2006 |

OTHER PUBLICATIONS

English translation of abstract of CN 101383341 A.
English translation of abstract of CN 1354371 A.
English translation of abstract of CN 201466055 U.
English translation of abstract of TW 2006015858 A.
Chinese search report dated Sep. 6, 2012.

* cited by examiner

*Primary Examiner* — Lex Malsawma
(74) *Attorney, Agent, or Firm* — McClure, Qualey & Rodack, LLP

(57) ABSTRACT

A method of wafer level purifying light color of a LED semiconsuctor is disclosed. After a LED wafer is fabricated, multi-transparent films formed of first layer and a second layer alternatively until reaching a predetermined number deposited by e-gun deposition with an aid of ion plasma beam. The first layer is formed of an oxide layer and the second layer is formed of a metal oxide layer. The two materials, one has a high index of refraction and the other has a low index of refraction. The total multi-transparent films are about 80 to 120 layer which can narrow wave width about a central wavelength.

12 Claims, 7 Drawing Sheets

| layer | film | thickness (nm) Green | Blue | layer | film | thickness (nm) Green | Blue |
|---|---|---|---|---|---|---|---|
| 1 | TiO2 | 32.58 | 56.85 | 41 | TiO2 | 58.54 | 44.64 |
| 2 | SiO2 | 67.74 | 26.06 | 42 | SiO2 | 129.91 | 116.8 |
| 3 | TiO2 | 102.78 | 38.7 | 43 | TiO2 | 95.54 | 50.2 |
| 4 | SiO2 | 72.92 | 41.97 | 44 | SiO2 | 85.63 | 79.15 |
| 5 | TiO2 | 39.49 | 22.66 | 45 | TiO2 | 47.21 | 52.05 |
| 6 | SiO2 | 85.86 | 119.52 | 46 | SiO2 | 87.28 | 84.74 |
| 7 | TiO2 | 29.16 | 17.57 | 47 | TiO2 | 45.53 | 83.23 |
| 8 | SiO2 | 59.79 | 42.11 | 48 | SiO2 | 78.53 | 104.99 |
| 9 | TiO2 | 35.72 | 52.58 | 49 | TiO2 | 57.64 | 85.81 |
| 10 | SiO2 | 72.59 | 254.35 | 50 | SiO2 | 126.83 | 111.01 |
| 11 | TiO2 | 40.56 | 12.23 | 51 | TiO2 | 64.94 | 63.92 |
| 12 | SiO2 | 62.32 | 18.38 | 52 | SiO2 | 119.05 | 98.85 |
| 13 | TiO2 | 46.85 | 71.53 | 53 | TiO2 | 52.85 | 39.87 |
| 14 | SiO2 | 70.88 | 143.22 | 54 | SiO2 | 78.44 | 86 |
| 15 | TiO2 | 50.83 | 56.61 | 55 | TiO2 | 58.48 | 107.9 |
| 16 | SiO2 | 57.01 | 108.67 | 56 | SiO2 | 89.86 | 81.92 |
| 17 | TiO2 | 103.75 | 99.59 | 57 | TiO2 | 63.45 | 46.6 |
| 18 | SiO2 | 129.92 | 42.24 | 58 | SiO2 | 109.96 | 54.46 |
| 19 | TiO2 | 9.21 | 41.93 | 59 | TiO2 | 60.36 | 25.41 |
| 20 | SiO2 | 52.53 | 175 | 60 | SiO2 | 102.99 | 91.01 |
| 21 | TiO2 | 44.72 | 45.08 | 61 | TiO2 | 56.85 | 65.65 |
| 22 | SiO2 | 46.49 | 94.5 | 62 | SiO2 | 85.14 | 121.03 |
| 23 | TiO2 | 47.08 | 126.59 | 63 | TiO2 | 64.03 | 52.36 |
| 24 | SiO2 | 65.5 | 82.56 | 64 | SiO2 | 146.82 | 80.8 |
| 25 | TiO2 | 37.53 | 6.5 | 65 | TiO2 | 13.05 | 55.99 |
| 26 | SiO2 | 22.81 | 78.88 | 66 | SiO2 | 177.39 | 88.6 |
| 27 | TiO2 | 63.07 | 82.92 | 67 | TiO2 | 90.96 | 55.97 |
| 28 | SiO2 | 109.75 | 105.65 | 68 | SiO2 | 47.53 | 74.11 |
| 29 | TiO2 | 72.33 | 38.04 | 69 | TiO2 | 70.49 | 67.41 |
| 30 | SiO2 | 114.68 | 118.36 | 70 | SiO2 | 121.25 | 120.33 |
| 31 | TiO2 | 65.47 | 27.86 | 71 | TiO2 | 71.1 | 34.49 |
| 32 | SiO2 | 68.21 | 155.39 | 72 | SiO2 | 141.22 | 57.68 |
| 33 | TiO2 | 74.88 | 55.95 | 73 | TiO2 | 122.21 | 40.13 |
| 34 | SiO2 | 139.26 | 148.37 | 74 | SiO2 | 85.11 | 86.28 |
| 35 | TiO2 | 89.14 | 74.21 | 75 | TiO2 | 65.79 | 100.91 |
| 36 | SiO2 | 61.22 | 94.98 | 76 | SiO2 | 85.89 | 75.6 |
| 37 | TiO2 | 28.77 | 49.12 | 77 | TiO2 | 51.95 | 50.7 |
| 38 | SiO2 | 65.37 | 125.23 | 78 | SiO2 | 125.22 | 191.38 |
| 39 | TiO2 | 31.12 | 89.19 | 79 | TiO2 | 99.18 | 48.25 |
| 40 | SiO2 | 116.49 | 47.54 | 80 | SiO2 | 58.07 | 164.43 |

FIG. 4

|  |  | thickness (nm) | |
|---|---|---|---|
| layer | film | Green | Blue |
| 81 | TiO2 | 71.08 | 62.6 |
| 82 | SiO2 | 168.76 | 143.43 |
| 83 | TiO2 | 96.02 | 69.99 |
| 84 | SiO2 | 119.54 | 104.63 |
| 85 | TiO2 | 72.41 | 140.88 |
| 86 | SiO2 | 87.18 | 100.47 |
| 87 | TiO2 | 85.85 | 128.87 |
| 88 | SiO2 | 140.37 | 148.22 |
| 89 | TiO2 | 91.26 | 31.38 |
| 90 | SiO2 | 91.01 | 82.81 |
| 91 | TiO2 | 73.25 | 111.41 |
| 92 | SiO2 | 119.69 | 57.91 |
| 93 | TiO2 | 93.78 | 80.99 |
| 94 | SiO2 | 165.39 | 126.94 |
| 95 | TiO2 | 51.07 | 47.49 |
| 96 | SiO2 | 115.19 | |
| 97 | TiO2 | 72.6 | |
| 98 | SiO2 | 201.85 | |
| 99 | TiO2 | 65.2 | |
| 100 | SiO2 | 172.59 | |
| 101 | TiO2 | 106.73 | |
| 102 | SiO2 | 83.09 | |
| 103 | TiO2 | 73.31 | |
| 104 | SiO2 | 146.79 | |
| 105 | TiO2 | 40.63 | |

FIG. 4 (continuous)

| layer | Film | Red Ray Thickness (nm) | layer | Film | Red Ray Thickness (nm) |
|---|---|---|---|---|---|
| 1 | TiO2 | 50.55 | 41 | TiO2 | 23.86 |
| 2 | SiO2 | 59.57 | 42 | SiO2 | 40.08 |
| 3 | TiO2 | 36.98 | 43 | TiO2 | 57.22 |
| 4 | SiO2 | 78.22 | 44 | SiO2 | 124.25 |
| 5 | TiO2 | 47.85 | 45 | TiO2 | 120.38 |
| 6 | SiO2 | 94.69 | 46 | SiO2 | 61.36 |
| 7 | TiO2 | 38.31 | 47 | TiO2 | 45.93 |
| 8 | SiO2 | 51.38 | 48 | SiO2 | 66.59 |
| 9 | TiO2 | 38.44 | 49 | TiO2 | 41.32 |
| 10 | SiO2 | 82.7 | 50 | SiO2 | 91.67 |
| 11 | TiO2 | 43.73 | 51 | TiO2 | 59.17 |
| 12 | SiO2 | 83.72 | 52 | SiO2 | 207.6 |
| 13 | TiO2 | 36.68 | 53 | TiO2 | 63.98 |
| 14 | SiO2 | 47.76 | 54 | SiO2 | 8.77 |
| 15 | TiO2 | 39.76 | 55 | TiO2 | 51.08 |
| 16 | SiO2 | 80.76 | 56 | SiO2 | 86.27 |
| 17 | TiO2 | 53.09 | 57 | TiO2 | 51.14 |
| 18 | SiO2 | 69.66 | 58 | SiO2 | 90.72 |
| 19 | TiO2 | 34.67 | 59 | TiO2 | 51.41 |
| 20 | SiO2 | 79.31 | 60 | SiO2 | 94.79 |
| 21 | TiO2 | 32.13 | 61 | TiO2 | 59.24 |
| 22 | SiO2 | 69.72 | 62 | SiO2 | 93.87 |
| 23 | TiO2 | 56.58 | 63 | TiO2 | 51.3 |
| 24 | SiO2 | 84.87 | 64 | SiO2 | 77.18 |
| 25 | TiO2 | 41.6 | 65 | TiO2 | 60.15 |
| 26 | SiO2 | 71.38 | 66 | SiO2 | 121.12 |
| 27 | TiO2 | 64.3 | 67 | TiO2 | 54.48 |
| 28 | SiO2 | 83.5 | 68 | SiO2 | 90.3 |
| 29 | TiO2 | 44.78 | 69 | TiO2 | 45.61 |
| 30 | SiO2 | 92.71 | 70 | SiO2 | 81.05 |
| 31 | TiO2 | 66.38 | 71 | TiO2 | 46.94 |
| 32 | SiO2 | 105.88 | 72 | SiO2 | 53.45 |
| 33 | TiO2 | 39.88 | 73 | TiO2 | 109.89 |
| 34 | SiO2 | 91.2 | 74 | SiO2 | 134.22 |
| 35 | TiO2 | 58.62 | 75 | TiO2 | 94.33 |
| 36 | SiO2 | 105.78 | 76 | SiO2 | 146.74 |
| 37 | TiO2 | 46.17 | 77 | TiO2 | 66.59 |
| 38 | SiO2 | 97.22 | 78 | SiO2 | 133.6 |
| 39 | TiO2 | 48.53 | 79 | TiO2 | 82.96 |
| 40 | SiO2 | 133.24 | 80 | SiO2 | 132.05 |

FIG. 5

| layer | film | thickness (nm) |
|---|---|---|
| 81 | TiO2 | 64.64 |
| 82 | SiO2 | 125.66 |
| 83 | TiO2 | 83.4 |
| 84 | SiO2 | 135.54 |
| 85 | TiO2 | 57.2 |
| 86 | SiO2 | 88.3 |
| 87 | TiO2 | 58.31 |
| 88 | SiO2 | 94.97 |
| 89 | TiO2 | 83.46 |
| 90 | SiO2 | 144.71 |
| 91 | TiO2 | 83.83 |
| 92 | SiO2 | 131.4 |
| 93 | TiO2 | 74.48 |
| 94 | SiO2 | 115.06 |
| 95 | TiO2 | 70.59 |
| 96 | SiO2 | 133.1 |
| 97 | TiO2 | 70.15 |
| 98 | SiO2 | 120.71 |
| 99 | TiO2 | 81.23 |
| 100 | SiO2 | 144.06 |
| 101 | TiO2 | 75.45 |
| 102 | SiO2 | 116.13 |
| 103 | TiO2 | 70.96 |
| 104 | SiO2 | 108.57 |
| 105 | TiO2 | 64.84 |
| 106 | SiO2 | 128.28 |
| 107 | TiO2 | 75.49 |
| 108 | SiO2 | 113.99 |
| 109 | TiO2 | 56.61 |
| 110 | SiO2 | 184.55 |
| 111 | TiO2 | 93.36 |
| 112 | SiO2 | 104.27 |
| 113 | TiO2 | 67.79 |
| 114 | SiO2 | 84.89 |
| 115 | TiO2 | 54.93 |
| 116 | SiO2 | 122.22 |
| 117 | TiO2 | 116.12 |
| 118 | SiO2 | 173.81 |
| 119 | TiO2 | 93.77 |
| 120 | SiO2 | 113.04 |

FIG. 5 (continuous)

METHOD OF WAFER LEVEL PURIFYING LIGHT COLOR EMITTING FROM A LIGHT EMITTING SEMICONDUCTOR WAFER

FIELD OF INVENTION

This invention relates to a light-emitting semiconductor wafer, particularly to a wafer level purifying light emitting from a semi-product of LED wafer by forming multi-transparent layers thereon as a filter.

BACKGROUND

The principles behind luminance of light emitting diodes are by injecting an electric current sequentially through P-N junctions of a semiconductor. The material of AlGaInP is implemented for high brightness red, orange, yellow and yellowish green LEDs and AlGaInN is for blue and green LEDs. The process of metal organic vapor phase epitaxy (MOVPE) is commonly adopted in the mass production of the LEDs, while the light-emitting components are of the structures, including: homo-junction (HOMO), single-heterostructure (SH), double-heterostructure (DH), single-quantum well (SQW) and multiple-quantum well (MQW) or other appropriate structures.

The structure of a conventional light emitting diode is illustrated in FIG. 1A, including, from a top thereof down formed with a front electrical electrode 11, a transparent oxide layer or a window layer 14 to disperse the current, an active layer 12, a substrate 10 and a back contact 13. Among them, the active layer 12 is formed by a light-emitting material, such as AlGaInP or AlGaInN by adopting MOVPE and the transparent conductive oxide layer 14 is a transparent conductive oxide layer typically formed of an indium tin oxide (ITO) layer. After a current is injected through the front contact 11, the current will pass through the transparent conductive oxide layer 14 to disperse and then through the active layer 12 and the substrate 10 to flow towards the back contact 13. Light is emitted when the current flows through the active layer 12. The active layer 12 is a sandwich layer, including a p-type upper cladding layer, an intrinsic layer and an n-type lower cladding layer. However, the low carrier mobility and high resistance of the active layer made of AlGaInP or AlGaInN results in poor electric conductivity of the AlGaInP or AlGaInN. Apart from that, the transparent conductive oxide layer 14 though can improve the current dispersion; its conductive ability is, however, weaker than that of a metal layer. Consequently, a metal grid layer (not shown) is generally embedded in the ITO layer 14, e.g., a metal grid layer formed on the active layer, and then covered it by forming an ITO layer thereover. The current distribution is getting improvement, nevertheless, the primary emitting regions are mainly concentrated at and next to the lower portion of the electrode, as shown in FIG. 1A.

The forgoing processes are exemplary for a light emiting semiconductor. However, due to auniformity manufacturing processes, the light color emitted from a LED die taken from a position A of a wafer is generally found to be deviated from that of another at a position distant from the position A. In practice, as long as a size of a wafer is over 2 inches in diameter, the wavelength emitting from the die 30 at the center portion of the wafer is found different from those of the dies 32, 33, 34 located from at the edges of the wafer. For instance, for a blue light LED wafer is concerned, light with a central wavelength emitted by a die 30 is assumed to be 440 nm but the variation of the central wavelength of the dies 34 may have light with a central wavelength 30-40 nm offset. The color deviation result may be further worse for two dies taken from the same relative position but different batches . . . . Consequently, it has been troublesome to the industry to discard those unqualified LEDs or not just due to a central wavelength out of a criteria range.

To LED illuminating industry, a small central wavelength shifting is generally acceptable but it doesn't if the LEDs are to mix with others so as to produce a desired decorative pattern. For example the appliance such as TV, notebook, and monitor using LED backlight, the quality criteria is stricter, particularly, to those high-end models.

SUMMARY OF INVENTION

It is a primary objective of this invention to provide a method of wafer level purifying the light color of LED chips.

The present invention discloses a method of wafer level purifying light color of a LED semiconductor by forming a quantity of transparent films as a filter. After a LED wafer is fabricated, multi-transparent films formed of first layer and a second layer alternatively until reaching a predetermined number deposited by e-gun deposition with an aid of ion plasma beam. The first layer is formed of an oxide layer and the second layer is formed of a metal oxide layer. The two materials, one has a high index of refraction and the other has a low index of refraction. The total multi-transparent films are about 80 to 120 layer which can narrow wave width about a central wavelength.

BRIEF DESCRIPTION OF THE DRAWINGS

These and other modifications and advantages will become even more apparent from the following detained description of preferred embodiments of the invention and from the drawings in which:

FIG. 4 shows the thickness of each layer of the multi-transparent layers of two LED wafers (blue and green light) in accordance with the present invention.

FIG. 5 shows the thickness of each layer of the multi-transparent layers a red color LED wafer in accordance with the present invention.

DETAILED DESCRIPTION OF THE INVENTION

As aforesaid the conventional LED wafer may have color deviation, e.g. the light emitting from a die located at the center portion of the wafer may be different from that of the die at the edge. While the color deviation out of range, the die may be picked out as an unqualified. Each die of the wafer has to be one-one quality control.

To overcome the problem, the present invention is to provide a LED wafer formed with multi-transparent layers thereon as a light filter to narrow a wavelength range thereby purifying the color. While the central wavelength of the entire wafer is filtered to a target wavelength, the quality control becomes simple. The QC carried out by picking the dies by just in accordance with illumines, i.e., light intensity. To the downstream LED industries, the quality is more reliable and easy to use.

Figure 1A:
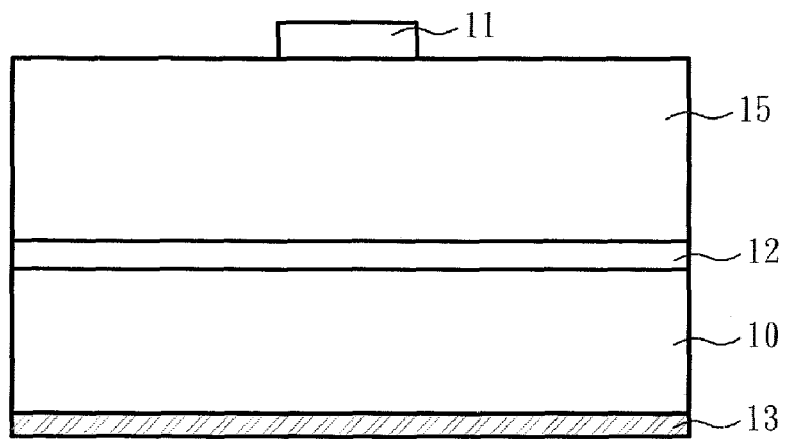
FIG. 1A is a cross-sectional view of a conventional light emitting diode structure having an ITO as transparent conductive oxide layer.
Figure 1B:
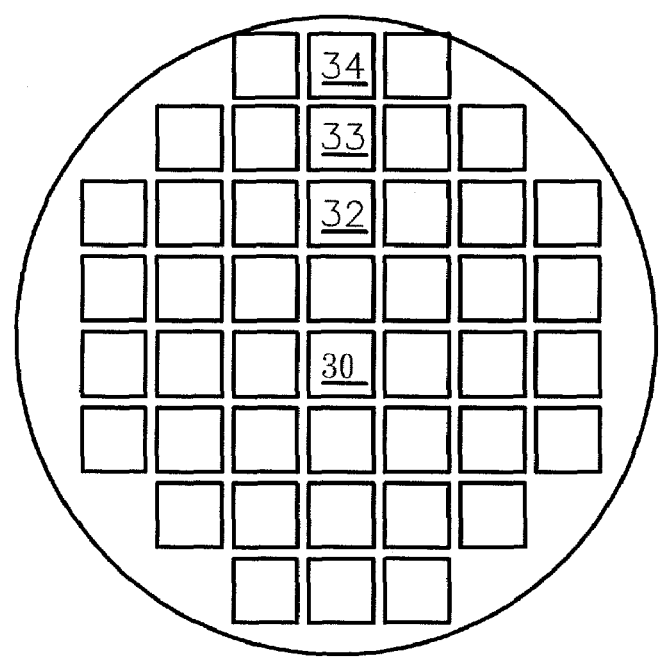
FIG. 1B is a top view of a conventional light emitting diode wafer having die formed.

The present invention can be applied to any LED wafer including the LED showing FIG. 1A, or the others, and the light may emitting from a single side or double sides. The central wavelength of the light from any dies on the wafer will be more consistent.

Figure 2:
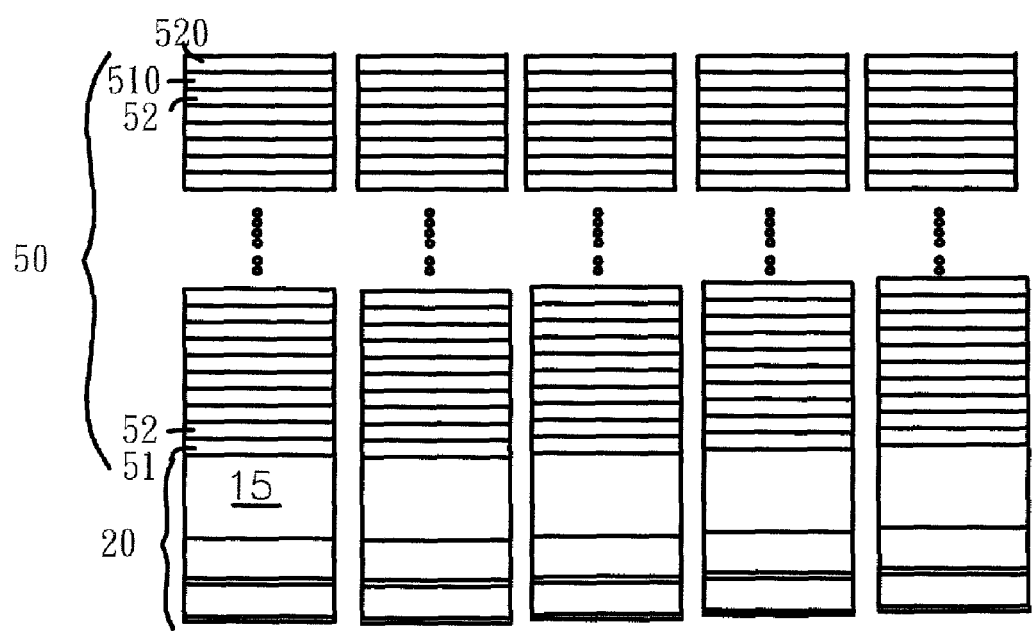
FIG. 2 is a cross-sectional view of a conventional light emitting diode structure having multi-transparent layers formed thereon as a light filter in accordance with the present invention.

Referring to FIG. 2, it shows multi-transparent layers 50 including a first transparent layer 51 alternatively with a second layer 52 many times on a conventional LED wafer. In a preferred embodiment, the first transparent layer 51 is $SiO_2$, and the second transparent layer 52 is $TiO_2$, their index of refraction, are respectively, 1.45~1.48 and 2.2~2.5. The candidates selected as the first transparent layer 51 may be other than $SiO_2$, such as a metal oxide such as ZrO2 or MgF2, and candidates selected as the second transparent layer 52' may be a $Ti_2O_5$, $Ta_2O_5$, $Nb_2O_5$. The requirements of the candidates to be selected are to choose different index of refraction for a first transparent layer 51 and the second transparent layer 52 and at best one is high and the other is low. Since a number of the multi-filtering layers 50 is over 80 or more, and thus, it is not important that the first transparent layer 51 has a high or low index of refraction.

An object of present invention is to make the central wavelength the same for any dies taken from the entire wafer after forming the multi-transparent layers no matter what the color deviation of the semi-product may be. That is the wavelength of the light emitting from a die at the center portion may have a large variation than that of a die at the edge of the wafer.

In accordance with a preferred embodiment, a material with a high index of refraction such as $TiO_2$ and $Ta_2O_5$ is either as a first transparent layer 51 deposited on the uppermost layer of the wafer such as an ITO layer or a p-type epi-layer or a second layer formed on the first transparent layer 51. The other low index of refraction material such as $SiO_2$ is served as a second layer formed on the first transparent layer 51. The two layers are alternatively deposited. The index of refraction of the uppermost layer of the wafer will affect the thickness of the first transparent layer 51, and the thickness and the index of refraction of the first transparent layer 51 will affect the incident angle of the post-layer.

According to a method of the present invention, the boundary conditions are demanded. They may include (1) setting a target central wavelength of emerging light (2) a lower limit of transmittance of the light after a number of the multi-transparent layers formed, e.g. 95% or (3) while a transmittance is 50%, the wave width±1%, 2%, or 3% (4) the incident angle of the light into the first layer from the uppermost LED layer, the incident angle should large than ±45°.

According to the boundary conditions, once materials of the first transparent layer 51 and the second transparent layer 52' are selected, and the thickness of the first layer is predetermined, the incident angle, and the thickness of the second layer will depend and then thickness of the third layer and so on until the outermost layer 520 will also be determined.

According to a preferred embodiment, the more pure of the central of the emerging light is, the more transparent layers are needed. Hence, it needs a mathematical model with a predetermined central wavelength and the related wave width, the total thickness as boundary conditions, the refractivities of the first and second transparent layers and the index of refraction of the wafer as parameters to calculate the thickness of each filtering layer.

After the thickness of the outermost layer 520 is determined, and then the second outermost layer 510 and the third outermost layer will be accordingly determined.

The characteristic matrix of the substrate is:

$$Ms = \begin{bmatrix} 1 \\ n_s \end{bmatrix},$$

where $n_s$ is an index of refractivity.

The characteristic matrix of a first transparent layer formed on the substrate can be expressed as:

$$M = \begin{bmatrix} \cos\delta & \frac{1}{\eta}\sin\delta \\ 1\eta\sin\delta & \cos\delta \end{bmatrix}$$

where $$\delta = \frac{2\eta}{\lambda}nd,$$

n is a real part of index of refraction of the transparent layer, d is the layer thickness. And λ is the wavelength of emerging light and i is an imaginary number.

Hence for The electric magnetic field of the first filtering layer formed on the substrate satisfied the equation:

$$\begin{bmatrix} E \\ H \end{bmatrix} = \begin{bmatrix} B \\ C \end{bmatrix} = MMs = \begin{bmatrix} \cos\delta & \frac{1}{\eta}\sin\delta \\ 1\eta\sin\delta & \cos\delta \end{bmatrix}\begin{bmatrix} 1 \\ n_s \end{bmatrix}$$

where E is intensity of the electric field and H is intensity of the magnetic field and $$Y = \frac{C}{B}$$

is the admittance.

Reflectivity $$R = \frac{n_0 - Y}{n_0 + Y}$$

where $n_0$ is the index of refraction of air.

For two filtering layers, a deposition sequence is film 1 on the film S and film 2 on the film 1, the relation of the films with the electric magnetic field will be:

$$\begin{bmatrix} E \\ H \end{bmatrix} = M_{22}M_{1s}M_s$$

For multi-layers, with the film 1 and film 2 deposited alternatively, the relation of the films with the electric magnetic field will be:

$$\begin{bmatrix} E \\ H \end{bmatrix} = \ldots M_{21}M_{12}M_{21}M_{1s}M_s$$

In accordance with a preferred embodiment, the wafer is cleaned by a plasma beam of an argon gas having a flow rate about 45 sccm and $O_2$ gas about 8 sccm. After that the deposition is carried out by electron-gun with an aid of plasma beam so that the multi-transparent film will get better adhesion. The parameters are as follows:

| material | Initial vacuum (pa) | Temperature on the tray | Vacuum (pa) after releasing $O_2$ | Deposition rate | E-Gun Current |
|---|---|---|---|---|---|
| $SiO_2$ | $2 \times 10^{-3}$ | 230° C. | $9 \times 10^{-3}$ | 0.8 nm/s | 250 mA |
| $Ti_3O_5$ | | | $2.2 \times 10^{-2}$ | 0.4 nm/s | 500 mA |

Ion Source

| material | V (voltage) | mA (current) | W power | Neutral-device Ratio of E/b % | Argon at ion source | $O_2$ gas at ion source | Argon gas at neutral-device |
|---|---|---|---|---|---|---|---|
| $SiO_2$ | 900 | 900 | 600 | 150 | 45 sccm | 0 | 8 sccm |
| $Ti_3O_5$ | 1000 | 900 | 600 | 150 | 45 sccm | 10 sccm | 8 sccm |
| cleaning | 600 | 500 | 400 | 170 | 45 sccm | 10 sccm | 8 sccm |

The neutral-device is for neutralization the charges at the ion source by an E/b % ratio by discharging. For instance, the current of the ion source is 900 mA, and an E/b % is of 150%, then the current of the neutral-device would be 1350 mA.

Figure 3:
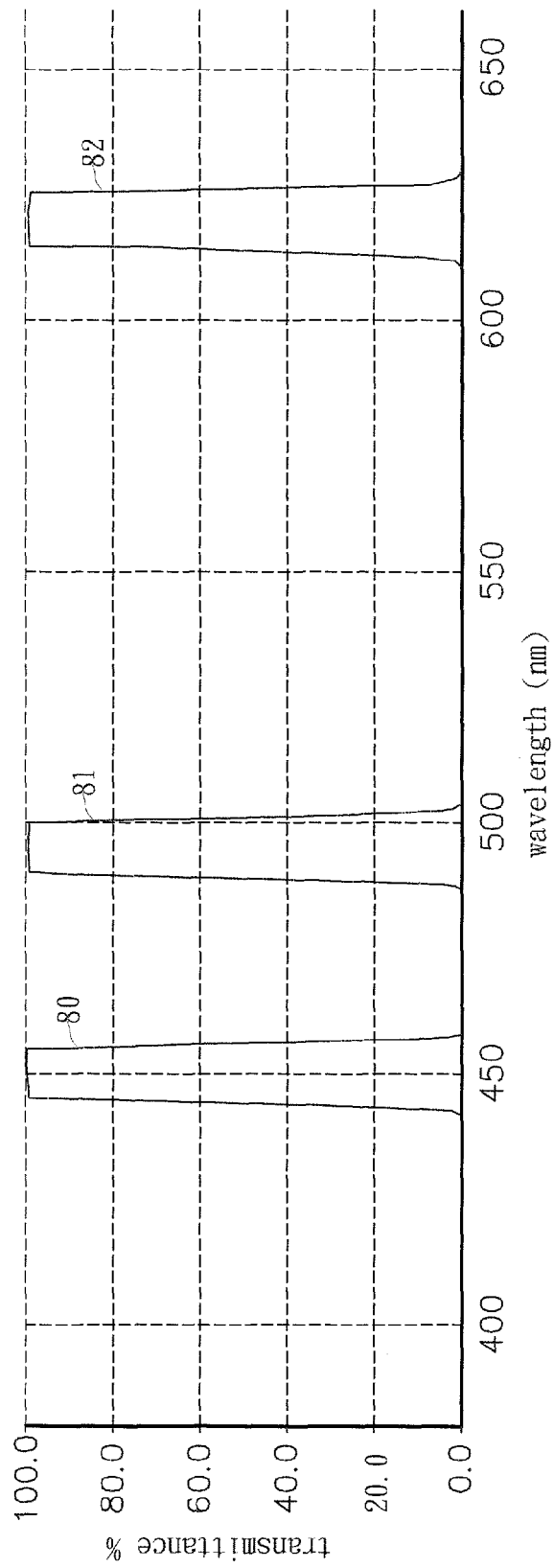
FIG. 3 shows simulation results of three light-spectrums of LED wafers having transparent films formed thereon as a light filter in accordance with the present invention.

FIG. 3 shows simulation results of spectrums 80, 81, 82 of the LED wafers having a central wavelength of 450 nm ±2%, 490 nm ±2%, and 620 nm ±2% (the central wave lengths with a wave width ±2%, transmittance 50%) respectively, formed with 95 layers, 105 layers, and 120 layers of multi-filter films on the blue-light LED wafer, green-light LED wafer, and red-light LED wafer.

FIG. 4 shows each thickness among 105 layers on the green-light LED wafer and each thickness of 95 layers on the blue-light LED wafer and FIG. 5 shows each thickness among 120 layers on the red-light LED wafer by calculation derived from the aforesaid mathematical equations. The FIG. 3 is the simulation results in accordance with the materials and the thicknesses in FIG. 4 and FIG. 5.

The benefits of the present invention are:
1. The light color of LED of the entire wafer is purified in according to the present invention so that it is very convenient to color mixing.
2. Since the light color provided by the LED dies is pure, so that the QC for LED needs just to drop those of transmittance unqualified out.
3. The method disclosed by the present invention can be applied to any LED wafer.

This invention is related to a novel creation that makes a breakthrough in the art. Aforementioned explanations, however, are directed to the description of preferred embodiments according to this invention. Since this invention is not limited to the specific details described in connection with the preferred embodiments, changes and implementations to certain features of the preferred embodiments without altering the overall basic function of the invention are contemplated within the scope of the appended claims.

What is claimed is:

1. A method of wafer level purifying light color of a LED wafer, comprising the steps of:
   providing a LED wafer having LED chips thereon and an uppermost film of said LED chips having a index of refraction $n_s$ for forming multi-filtering layers;
   choosing silicon oxide as a first material "A" having a index of refraction $n_A$;
   choosing a metal oxide as a second material "B" having a index of refraction $n_B$, said $n_B > n_A$;
   setting a predetermined central wavelength according to a type of said LED wafer;
   setting a deposition order by $A_1B_1A_2B_2\ldots A_TB_T$ wherein sub-indexes represents a depositing sequence;
   listing mathematical algebra equations with a series of characteristic matrixes product of the layer to layer;
   calculating thicknesses of all transparent films by solving said algebra equations; and
   depositing said transparent films with said first material and said second material alternatively according to the calculated thicknesses.

2. The method according to claim 1 furthering comprising a step of cleaning said LED wafer by using an inert gas plasma.

3. The method according to claim 1 furthering comprising a step of setting a lower limit of transmittance of emerging light from the outermost transparent film as a boundary condition.

4. The method according to claim 1 wherein said step of calculating is done from an outmost transparent film, layer to layer inward to the LED chip.

5. The method according to claim 1 wherein said second material is selected from $TiO_2$ or $Ti_2O_5$.

6. The method according to claim 1 wherein said step of depositing is carried out by using electron-gun deposition with aid of ion-plasma beam.

7. The A method of wafer level purifying light color of a LED wafer, comprising the step of:
   cleaning said LED wafer by using inert gas plasma, said LED wafer having an index of refraction $n_s$;
   choosing silicon oxide as a first material "A" having a index of refraction $n_A$;
   choosing a metal oxide as a second material "B" having a index of refraction $n_B$, said $n_B > n_A$;
   setting a deposition order by $A_1B_1A_2B_2\ldots A_TB_T$ of multi-transparent layers wherein sub-indexes represents a depositing sequence and a"T" value is determined according to an estimated purify target and;
   predetermining a thickness of each layer by solving a characteristic matrix equation, which is constituted by mathematical algebra equations with a series of characteristic matrixes product of the layer to layer using boundary condition including (1) a target central wavelength according to an emerging light color of said LED wafer, (2) said $n_A$, $n_B$, and $n_S$, (3) a lowest limit of a transmittance of light emerging out from said layer $B_T$, (4) incident angle;
   depositing a first transparent layer and a second transparent layer alternatively all the way until a target number "T" is reached wherein said first transparent layer is formed of an oxide layer with a first index of refraction and said second transparent layer is formed of a metal oxide layer with a second index of refraction, and said second index of refraction is larger than said second index of refraction.

8. The method according to claim 7, wherein said second material is selected from $TiO_2$ and $Ti_2O_5$.

9. The method according to claim 7, wherein said first material is $SiO_2$.

10. The method according to claim 7 wherein said step of depositing is carried out by using electron-gun deposition with aid of ion-plasma beam.

11. The method according to claim 7 wherein said target number "T" is different while reaching the same half-band width target for different light color of LED.

12. The method according to claim 7 wherein said target number "T" is of 45, 50, 55 respectively, for a blue light LED, a green light LED, and a red light LED.

* * * * *